United States Patent
Mansour

(10) Patent No.: US 10,263,638 B2
(45) Date of Patent: Apr. 16, 2019

(54) LOSSLESS COMPRESSION METHOD FOR GRAPH TRAVERSAL

(71) Applicant: Texas Instruments Incorporated, Dallas, TX (US)

(72) Inventor: Mohamed Farouk Mansour, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 160 days.

(21) Appl. No.: 15/168,992

(22) Filed: May 31, 2016

(65) Prior Publication Data

US 2017/0346503 A1 Nov. 30, 2017

(51) Int. Cl.
G06F 17/30 (2006.01)
H03M 7/46 (2006.01)
H03M 7/40 (2006.01)
H03M 7/30 (2006.01)

(52) U.S. Cl.
CPC .............. *H03M 7/46* (2013.01); *H03M 7/40* (2013.01); *H03M 7/70* (2013.01); *G06F 17/30153* (2013.01); *G06F 17/30324* (2013.01)

(58) Field of Classification Search
CPC ..................... G06F 17/30324; G06F 17/30153
See application file for complete search history.

(56) References Cited

U.S. PATENT DOCUMENTS

| | | | | |
|---|---|---|---|---|
| 5,907,297 A | * | 5/1999 | Cohen | H03M 7/30 341/50 |
| 6,278,992 B1 | * | 8/2001 | Curtis | G06F 17/30324 707/711 |
| 7,565,380 B1 | * | 7/2009 | Venkatachary | G06F 7/02 |
| 7,620,666 B1 | * | 11/2009 | Root | G06F 11/1451 |
| 9,793,920 B1 | * | 10/2017 | Kataoka | H03M 7/3084 |
| 9,844,092 B2 | * | 12/2017 | Kim | H04W 76/04 |
| 2002/0095421 A1 | * | 7/2002 | Koskas | G06F 17/30595 |
| 2010/0223237 A1 | * | 9/2010 | Mishra | G06F 9/30156 707/693 |
| 2012/0002895 A1 | * | 1/2012 | Blum | H03M 7/30 382/251 |
| 2013/0080725 A1 | * | 3/2013 | Usui | G06F 3/061 711/162 |
| 2013/0282953 A1 | * | 10/2013 | Orme | G06F 12/0238 711/102 |
| 2015/0030036 A1 | * | 1/2015 | Wang | H04L 69/04 370/477 |
| 2016/0139842 A1 | * | 5/2016 | Nakata | G06F 3/0619 711/162 |
| 2017/0103123 A1 | * | 4/2017 | Kataoka | G06F 17/30628 |
| 2017/0300491 A1 | * | 10/2017 | Kataoka | G06F 17/3033 |
| 2018/0232420 A1 | * | 8/2018 | Kaldewey | G06F 17/30324 |

\* cited by examiner

*Primary Examiner* — Richard L Bowen

(74) *Attorney, Agent, or Firm* — Kenneth Liu; Charles A. Brill; Frank D. Cimino

(57) ABSTRACT

To enable lossless compression, an auxiliary bitmap is used to provide side information about the graph bitmap. Each bit in the auxiliary bitmap represents a word in the graph bitmap. A zero bit in the auxiliary bitmap means that the corresponding word in the graph bitmap is not transmitted. Therefore, it is set to the default value, λ, during decompression. This default value could be either an all-zeros word, or all-ones word depending on the BFS step. A one bit in the auxiliary bitmap means that the corresponding word in the graph bitmap is transmitted.

16 Claims, 3 Drawing Sheets

LOSSLESS COMPRESSION METHOD FOR GRAPH TRAVERSAL

TECHNICAL FIELD OF THE INVENTION

The technical field of this invention is lossless compression for graph traversal.

BACKGROUND OF THE INVENTION

Graph traversal is a core operation that is used in many graph processing applications. It involves visiting all nodes in the graph at most once in a particular order. The traversal procedure is typically performed in distinct steps where nodes at a particular level could be discovered in any order. Breadth-First Search (BFS) and Depth-First Search (DFS) are common examples of graph traversal.

Some of the applications of graph traversal are finding all reachable nodes (for garbage collection), finding the best reachable node (single-player game search), finding the best path through a graph (for routing and map directions) or topologically sorting a graph.

SUMMARY OF THE INVENTION

Graph traversal is a commonly used operation. When a distributed processing system is used, the devices must communicate their local bitmaps to all other devices. A method of lossless compression is shown that reduces the amount of data that needs to be communicated between processing nodes.

BRIEF DESCRIPTION OF THE DRAWINGS

These and other aspects of this invention are illustrated in the drawings, in which.

DETAILED DESCRIPTION OF PREFERRED EMBODIMENTS

Figure 1:
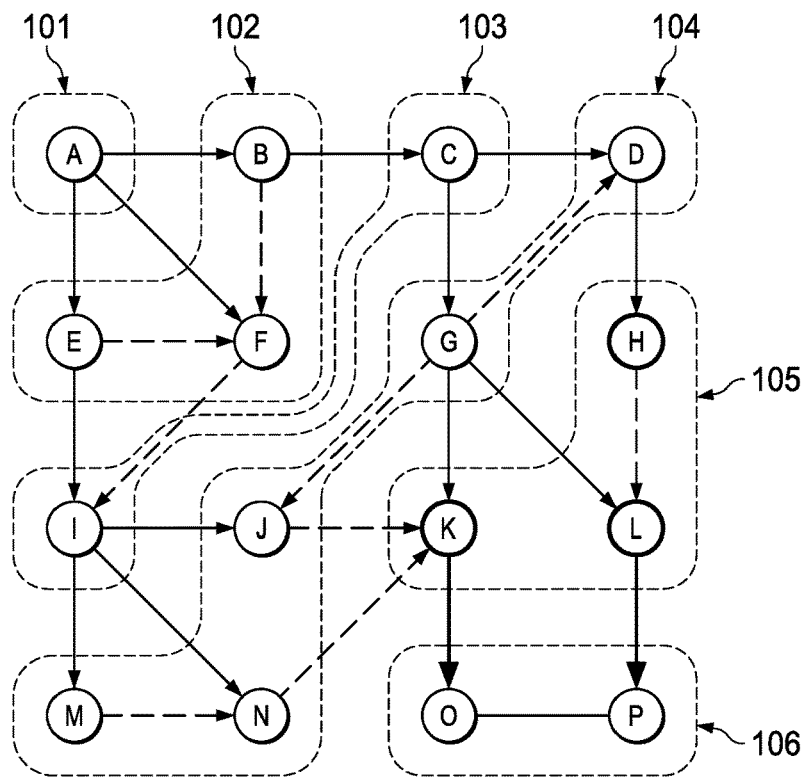
FIG. 1 shows a graphical representation of the breath first search method.

The breadth-first search is shown in FIG. 1. The search starts with a root node 101. In the first stage, all neighbors of the root node are discovered and added to the nodes frontier 102. In the following stages, unvisited nodes from the neighbors of the frontier nodes are discovered and added to the frontier as shown by 103 through 106. The search iterates until no more nodes could be added to the frontier.

To prevent multiple visiting of a given node during graph traversal in a distributed processing system, the node status should be available to all neighbors. This status could either be visited or unvisited, i.e., a single bit is needed to represent the node status. Hence, the whole graph is represented by a binary bitmap where the number of bits equals the number of nodes in the graph.

In distributed systems, individual devices process disjoint subsets of nodes. Each device holds a local bitmap that holds the status of its local nodes. These local bitmaps need to be communicated to other devices during graph traversal to avoid redundant traversal of graph nodes. A compression method is described in this invention for the raw bitmap that significantly reduces the bitmap size and provides more efficient communication.

Each node in the graph is represented by a single bit that indicates whether the node is visited or unvisited. Bits of the graph bitmap are combined in words, where the word size is chosen as 8, 16, 32, or 64 bits to simplify software implementation. The bits of a given word in the bitmap may represent successive or interleaved local nodes (based on the node ID). Interleaving of nodes is optimized to maximize the similarity between nodes within a word, i.e., nodes in the same word are likely to have the same status during graph traversal.

Figure 2:
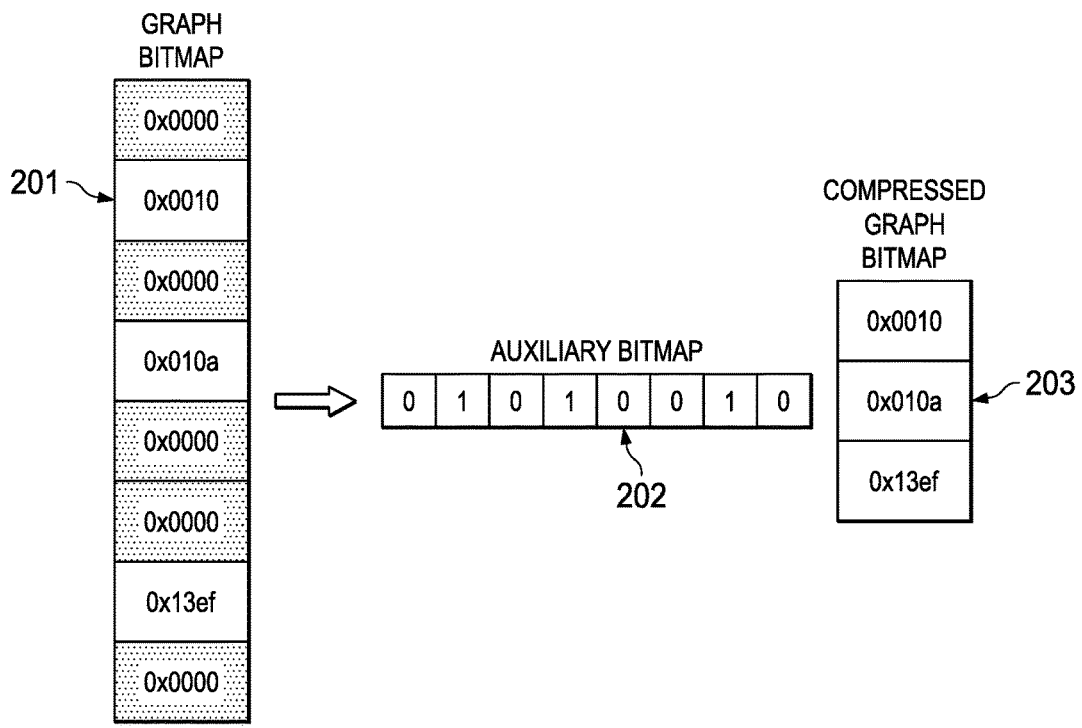
FIG. 2 illustrates the compression method shown in the invention.

The bitmap compression procedure shown in FIG. 2 exploits the similarity between words in the graph bitmap 201 to transmit only the words of the bitmap that aid the current traversal step.

In the first few steps of the breath first search (BFS), most of the nodes are unvisited. Hence, the graph bitmap is dominated by all-zeros words. Conversely, in the final stages the graph bitmap is dominated by all-ones words. At a given BFS step, only the nodes that are discovered in the earlier step (i.e., the frontier nodes) are relevant. Therefore, we could either transmit information about the whole graph bitmap or only the bitmap of the frontier nodes, whichever provides more compression.

To enable lossless compression, an auxiliary bitmap 202 is generated that provides side information about the graph bitmap. Each bit in the auxiliary bitmap represents a word in the graph bitmap. A zero bit in the auxiliary bitmap means that the corresponding word in the graph bitmap is not transmitted. Therefore, it is set to the default value, $\lambda$, during decompression. This default value could be either an all-zeros word, or all-ones word depending on the BFS step. A one bit in the auxiliary bitmap means that the corresponding word in the graph bitmap is transmitted. An example of this coding procedure, with $\lambda=0$, is shown in FIG. 2, where 203 shows the generated compressed bitmap.

To further improve the coding efficiency, the auxiliary bitmap is encoded using standard Huffman encoding with more emphasis to the more sparse patterns.

The coding efficiency could be further improved by marking all isolated nodes (i.e., nodes with no neighbors) as visited during the initialization of the graph bitmap. The status of these nodes will never change, and this assignment improves the compression performance at later BFS steps.

Figure 3:
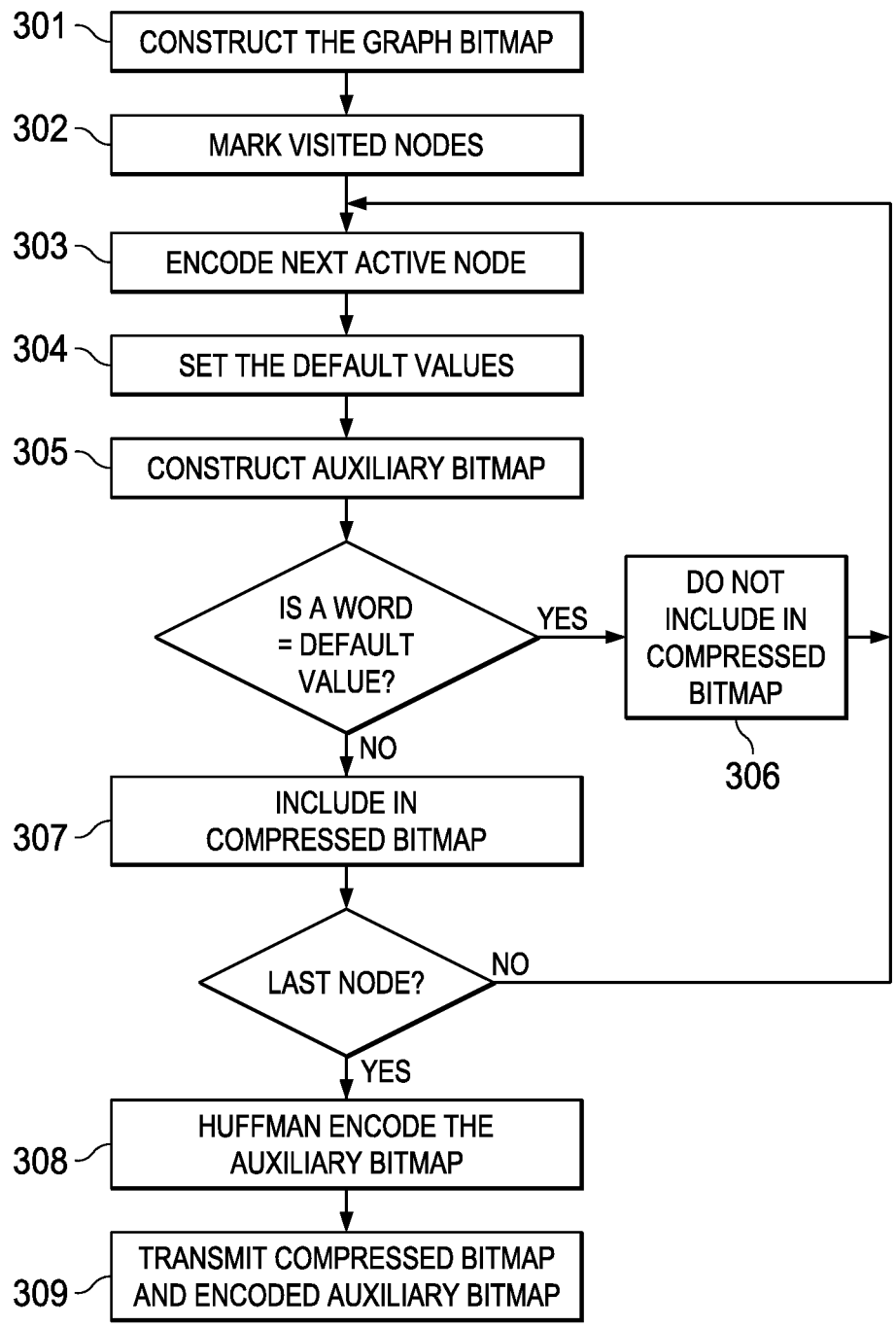
FIG. 3 is a flow chart of the steps involved in the compression method.

The compression algorithm is shown in FIG. 3, where:

(301) The graph bitmap is constructed by combining the status graph nodes in words. The nodes may be in their original order, or they may be interleaved. The interleaving is used to maximize the similarity between the statuses of nodes within a word. For example, column interleaving may be used such that the graph nodes are ordered in rows (according to their ID), where the total number of rows equal the width of the graph bitmap word. Then each word in the graph bitmap corresponds to a single column.

(302) Mark all the isolated nodes in the graph as visited in the graph bitmap.

(303) For the first stages in the Breadth-First search, only the active nodes in the graph frontier are encoded. These nodes are found by XORing the current graph bitmap with the graph bitmap at the previous BFS step. In these first stages, the default value of compression, $\lambda$, is set to zero.

(304) For the later stages, the graph bitmap itself is used for compression. In these stages, the default value of compression, $\lambda$, is set to all-ones word.

(305) An auxiliary bitmap is constructed, where each bit in the auxiliary bitmap represents a word in the graph bitmap.
(306) If a word in the graph bitmap equals the default value, λ, set the corresponding bit in the auxiliary bitmap to zero, and do not include this word in the compressed graph bitmap.
(307) Otherwise, if a word in the graph bitmap does not equal the default value, λ, set the corresponding bit in the auxiliary bitmap to one, and include this word in the compressed graph bitmap.
(308) After constructing the entire auxiliary bitmap, Huffman encoding is used for additional lossless compression of the auxiliary bitmap.
(309) Both the encoded auxiliary bitmap and the compressed graph bitmap are included as the output of the compression algorithm.

Figure 4:
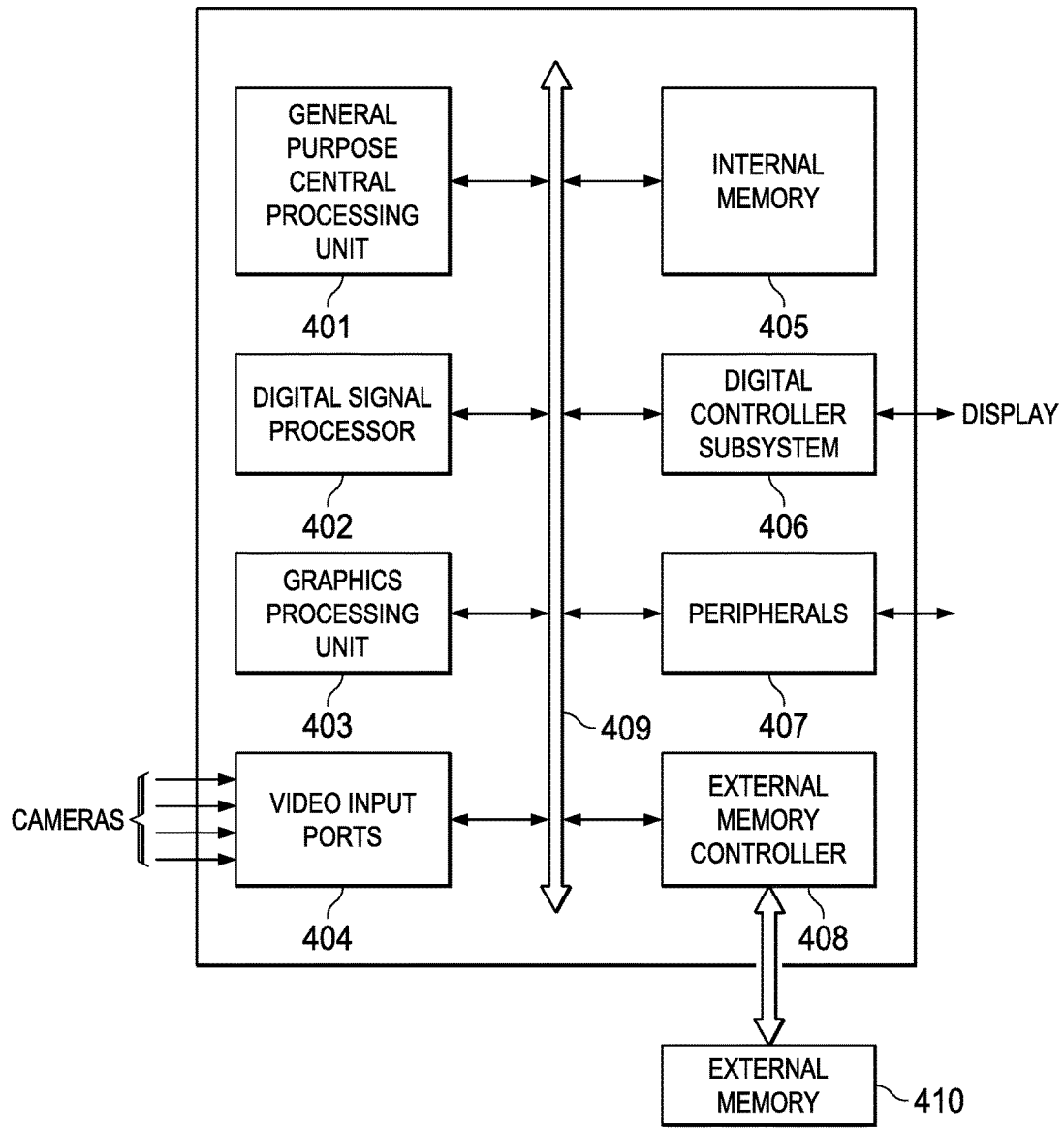
FIG. 4 shows a block diagram of a processor that may be employed to implement the method of this invention.

FIG. 4 shows a processor that may be used to implement the methods of this invention. The processor consists of a general purpose processing unit 401, a digital signal processor 402, a graphics processing unit 403, one or more video output ports 404, internal memory 405, a display controller subsystem 406, one or more peripherals 407, an external memory controller 408, and external memory 410. These system blocks are operable to communicate through bus 409.

What is claimed is:

1. A method of data compression comprising:
constructing a graph bitmap as a sequence of a plurality of words each being of a same predetermined size, wherein the graph bitmap is representative of a graph having a plurality of nodes with each node being represented by a bit indicating whether the node has been visited, and each of the words includes two or more of bits representing nodes of the graph;
constructing an auxiliary bitmap having a plurality of bits with each individual bit corresponding to a respective one of the words of the graph bitmap by, for each individual bit of the auxiliary bitmap, setting the bit to a first logic value if the respective word of the graph bitmap corresponding to the bit matches a predetermined default value and setting the bit to a second logic value if the respective word of the graph bitmap corresponding to the bit does not match the predetermined default value, wherein the predetermined default value is variable and has a first value for a beginning word in the sequence and a second value different from the first value for a last word in the sequence;
constructing a compressed graph bitmap by including in the compressed graph bitmap the words of the graph bitmap corresponding to bits of the auxiliary bitmap that are set to the second logic value but not the words of the graph bitmap corresponding to bits of the auxiliary bitmap that are set to the first logic value;
encoding the auxiliary bitmap; and
transmitting the encoded auxiliary bitmap and the compressed graph bitmap together as a compressed representation of the graph bitmap.

2. The method of claim 1, wherein the encoding of the auxiliary bitmap is performed using Huffman encoding.

3. The method of claim 1, wherein constructing the graph bitmap includes first determining whether any nodes of the graph are isolated nodes and identifying any such isolated nodes as visited nodes.

4. The method of claim 1, wherein, for at least one word of the graph bitmap, the bits of the at least one word represent successive nodes of the graph.

5. The method of claim 1, wherein, for at least one word of the graph bitmap, the bits of the at least one word represent interleaved nodes of the graph.

6. The method of claim 5, wherein the interleaved nodes are column interleaved.

7. The method of claim 1, wherein the words of the graph bitmap are at least partially determined using a breadth-first search.

8. The method of claim 1, wherein:
the predetermined default value has a size defined by a plurality of bits with the size of the predetermined default value being equal to the predetermined size of each word;
all bits of the predetermined default value are set to zero when the predetermined default value is the first value; and
all bits of the predetermined default value are set to one when the predetermined default value is the second value.

9. A data processing apparatus comprising:
a data output terminal;
memory to store instructions;
a processor to execute the instructions stored in the memory, wherein execution of the instructions by the processor causes the data processing apparatus to:
construct a graph bitmap as a sequence of a plurality of words each being of a same predetermined size, wherein the graph bitmap is representative of a graph having a plurality of nodes with each node being represented by a bit indicating whether the node has been visited, and each of the words includes two or more of bits representing nodes of the graph;
construct an auxiliary bitmap having a plurality of bits with each individual bit corresponding to a respective one of the words of the graph bitmap by, for each individual bit of the auxiliary bitmap, setting the bit to a first logic value if the respective word of the graph bitmap corresponding to the bit matches a predetermined default value and setting the bit to a second logic value if the respective word of the graph bitmap corresponding to the bit does not match the predetermined default value, wherein the predetermined default value is variable and has a first value for a beginning word in the sequence and a second value different from the first value for a last word in the sequence;
construct a compressed graph bitmap by including in the compressed graph bitmap the words of the graph bitmap corresponding to bits of the auxiliary bitmap that are set to the second logic value but not the words of the graph bitmap corresponding to bits of the auxiliary bitmap that are set to the first logic value;
encode the auxiliary bitmap; and
output the encoded auxiliary bitmap and the compressed graph bitmap together as a compressed representation of the graph bitmap via the data output terminal.

10. The data processing apparatus of claim 9, wherein the encoding of the auxiliary bitmap is performed using Huffman encoding.

11. The data processing apparatus of claim 9, wherein constructing the graph bitmap includes first determining whether any nodes of the graph are isolated nodes and identifying any such isolated nodes as visited nodes.

12. The data processing apparatus of claim 9, wherein, for at least one word of the graph bitmap, the bits of the at least one word represent successive nodes of the graph.

13. The data processing apparatus of claim 9, wherein, for at least one word of the graph bitmap, the bits of the at least one word represent interleaved nodes of the graph.

14. The data processing apparatus of claim 13, wherein the interleaved nodes are column interleaved.

15. The data processing apparatus of claim 9, wherein the words of the graph bitmap are at least partially determined using a breadth-first search.

16. The data processing apparatus of claim 9, wherein:
the predetermined default value has a size defined by a plurality of bits with the size of the predetermined default value being equal to the predetermined size of each word;
all bits of the predetermined default value are set to zero when the predetermined default value is the first value; and
all bits of the predetermined default value are set to one when the predetermined default value is the second value.

\* \* \* \* \*